(12) United States Patent
Blake

(10) Patent No.: US 8,655,814 B1
(45) Date of Patent: *Feb. 18, 2014

(54) MODELING EFFICIENCY OVER A RANGE OF VELOCITIES IN UNDERWATER VEHICLES

(71) Applicant: Zytek Communications Corporation, Vancouver (CA)

(72) Inventor: Robert W. Blake, Richmond (CA)

(73) Assignee: Zytek Communications Corporation, Vancouver (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/919,191

(22) Filed: Jun. 17, 2013

Related U.S. Application Data

(63) Continuation of application No. 12/824,185, filed on Jun. 27, 2010, now Pat. No. 8,468,108.

(60) Provisional application No. 61/222,059, filed on Jun. 30, 2009.

(51) Int. Cl.
| | |
|---|---|
| *G06F 15/18* | (2006.01) |
| *G06N 3/08* | (2006.01) |
| *G06N 3/04* | (2006.01) |
| *G05D 1/02* | (2006.01) |
| *B63H 21/21* | (2006.01) |
| *G05D 1/00* | (2006.01) |
| *B60L 3/00* | (2006.01) |

(52) U.S. Cl.
CPC .. *G06N 3/08* (2013.01); *G06N 3/04* (2013.01); *G05D 1/0206* (2013.01); *B63H 21/213* (2013.01)
USPC .............................................. 706/25; 701/21

(58) Field of Classification Search
CPC ......... G06N 3/08; G06N 3/04; G05D 1/0206; B63H 21/213
USPC ............................................... 706/25; 701/21
See application file for complete search history.

(56) References Cited

U.S. PATENT DOCUMENTS

| | | | |
|---|---|---|---|
| 6,138,604 | A | 10/2000 | Anderson et al. |
| 7,865,268 | B2 | 1/2011 | Valdivia y Alvarado et al. |

(Continued)

OTHER PUBLICATIONS

Blake, R. W and K. H. S. Chan. "Models of the turning and fast-start swimming dynamics of aquatic vertebrates." Journal of fish biology 69.6 (2006): 1824-1836.*

(Continued)

*Primary Examiner* — Jeffrey A Gaffin
*Assistant Examiner* — James F Sugent
(74) *Attorney, Agent, or Firm* — Stephen W. Melvin

(57) ABSTRACT

A method of generating a model of propulsive efficiency for an autonomous underwater vehicle (AUV) is based on a multilayer perception neural network model using data from aquatic species, such as undulatory fin propulsion in the knifefish (*Xenomystus nigri*), and a sensitivity analysis is used to lower the number of required inputs. The model of propulsive efficiency allows an AUV to achieve high values of propulsive efficiency over a range of forward velocity, giving a lowered energy drain on the battery. In an embodiment, externally monitored information, such as that on flow velocity, is conveyed to an apparatus residing in the vehicle's control unit, which in turn signals the locomotive unit to adopt kinematics, such as fin frequency and amplitude, associated with optimal propulsion efficiency. Power savings could protract vehicle operational life and/or provide more power to other functions, such as communications.

13 Claims, 4 Drawing Sheets

(56) References Cited

U.S. PATENT DOCUMENTS 7,869,910 B1     1/2011    Bandyopadhyay et al.
8,065,046 B2    11/2011    Bandyopadhyay et al.

OTHER PUBLICATIONS

Blake, Robert W., and Keith HS Chan. "Swimming in the upside down catfish *Synodontis nigriventris*: it matters which way is up." Journal of Experimental Biology 210.17 (2007): 2979-2989.*
Dunbabin, Matthew, et al. "A hybrid Auv design for shallow water reef navigation." Robotics and Automation, 2005. ICRA 2005. Proceedings of the 2005 IEEE International Conference on. IEEE, 2005.*
Hong, Chen, and Zhu Chang-an. "Modeling the dynamics of biomimetic underwater robot fish." Robotics and Biomimetics (ROBIO). 2005 IEEE International Conference on. IEEE, 2005.*
Lighthill, M. J., "Hydromechanics of Aquatic Animal Propulsion, Annual Review of Fluid Mechanics," vol. 1, pp. 413-446, 1969.
Lighthill, M. J., "Aquatic Animal Propulsion of High Hydromechanical Efficiency," Journal of Fluid Mechanics, vol. 44, Part 2, pp. 265-301, 1970.
Blake, R. W., "Mechanics of Ostraciiform Propulsion," Canadian Journal of Zoology, vol. 59, pp. 1067-1071, 1981.
Blake, R. W., "Swimming in the Electric Eels and Knifefishes," Canadian Journal of Zoology, vol. 61., pp. 1432-1441, 1983.
McCulloch, W. S., and Pitts, W., "A Logical Calculus of the Ideas Immanent in Nervous Activity," Bulletin of Mathematical Biology, vol. 52, No. 1/2, pp. 99-115, 1990.
Triantafyllou, M. S., and Triantafyllou, G. S., "An Efficient Swimming Machine," Scientific American, vol. 272, Issue 3, pp. 64-70, Mar. 1995.
Kong, L. X., Hodgson, P. D., and Collinson, D. C., "Modelling the Effect of Carbon Content on Hot Strength Steels Using a Modified Artificial Neural Network," ISIJ International, vol. 38, No. 10, pp. 1121-1129, 1998.
Ostrowski, J., and Burdick, J., "The Geometric Mechanics of Undulatory Robotic Locomotion," The International Journal of Robotics Research, vol. 17, No. 7, pp. 683-701, Jul. 1998.
Salehfar, H., and Benson, S. A., "Electric Utility Coal Quality Analysis Using Artificial Neural Network Techniques," Neurocomputing, vol. 23, pp. 195-206, 1998.
Gordon, M. S., Hove, J. R., Webb, P. W., and Weihs, D., "Boxfishes and Unusually Well-Controlled Autonomous Underwater Vehicles," Physiological and Biological Zoology, vol. 73, No. 6, pp. 663-671, 2000.
Triantafyllou, M. S., Triantafyllou, G. S., and Yue, D. K. P., "Hydrodynamics of Fishlike Swimming," Annual Review of Fluid Mechanics, vol. 32, pp. 33-53, 2000.
Walker, J. A., "Does a Rigid Body Limit Maneuverability?," The Journal of Experimental Biology, vol. 203, pp. 3391-3396, 2000.
Hove, J. R., O'Bryan, L. M., Gordon, M. S., Webb, P. W., and Weihs, D., "Boxfishes (Teleoste: Ostraciidae) As a Model System for Fishes Swimming With Many Fins: Kinematics," The Journal of Experimental Biology, vol. 204, pp. 1459-1471, 2001.
Morgansen, K. A., Duindam, V., Mason, R. J., Burdick, J. W., and Murray, R. M., "Nonlinear Control Methods for Planar Carangiform Robot Fish Locomotion," Proceedings of the 2001 IEEE International Conference on Robotics and Automation, pp. 427-434, 2001.
Bartol, I. K., Gharib, M., Weihs, D., Webb, P. W., Hove, J. R., and Gordon, M. S., "Hydrodynamic Stability of Swimming in Ostraciid Fishes: Role of the Carapace in the Smooth Trunkfish Lactophyrs Triqueter (Teleostei: Ostraciidae)," The Journal of Experimental Biology, vol. 206, pp. 725-744, 2003.
Trease, B. P., Lu, K-J., and Kota, S., "Biomimetric Compliant System for Smart Actuator-Driven Aquatic Propulsion: Preliminary Results," Proceedings of 203 ASME International Mechanical Engineering Congress & Exposition (IMECE'03), Nov. 2003.
Blake, R. W., "Fish Functional Design and Swimming Performance," Journal of Fish Biology, vol. 65, pp. 1193-1222, 2004.
Kim, E., and Youm, Y., "Design and Dynamic Analysis of Fish Robot: PoTuna," Proceedings of the 2004 IEEE International Conference on Robotics and Automation, pp. 4887-4892, Apr. 2004.
Bandyopadhyay, P. R., "Trends in Biorobotic Autonomous Undersea Vehicles," IEEE Journal of Oceanic Engineering, vol. 30, No. 1, pp. 109-139, Jan. 2005.
Deng, X., and Avadhanula, S., "Biomimetric Micro Underwater Vehicle with Oscillating Fin Propulsion: System Design and Force Measurement," Proceedings of the 2005 IEEE International Conference on Robotics and Automation, pp. 3312-3317, Apr. 2005.
Li, J., Chan, K. H. S., Blake, R. W., and Kwok, P. W. L, "Evaluation Using Multilayer Perception Neural Networks: A Case Study of Undulatory Median Fin Swimming in the Knifefish *Xenomystus nigri*," Journal of Fish Biology, vol. 71, pp. 1203-1207, 2007.
Bartol, I. K., Gordon, M. S., Webb, P., Weihs, D., and Gharib, M., "Evidence of Self-Correcting Spiral Flows in Swimming Boxfishes," Bioinspiration & Biomimetrics, vol. 3, 2008.
Collins, K., Forster, F., Dolan, S., Bowyer, A., and Megill, W., "Kinematics and Force Characterization of a Knifefish-Inspired Mechanical Propulsor," Conference Proceedings at Biological Approaches to Engineering Conference, pp. 30-33 and slides, Mar. 2008.
Morgansen, K., Triplett, B., and Klien, D., "Geometric Methods for Modeling and Control of Free-Swimming Fin-Actuated Underwater Vehicles," IEEE Transactions on Robotics, vol. 23, No. 6, Dec. 2007, pp. 1184-1199.
Ming, W., Junzhi, Y., Min, T., Quinhai, Y., "Back-Propagation Neural Network Based Predictive Control for Biomimetic Robotic Fish," Proceedings of the 27th Chinese Control Conference, Jul. 16-18, 2008, pp. 430-434.

\* cited by examiner

MODELING EFFICIENCY OVER A RANGE OF VELOCITIES IN UNDERWATER VEHICLES

RELATED APPLICATIONS

This application is a continuation of U.S. patent application Ser. No. 12/824,185, filed on Jun. 27, 2010, now U.S. Pat. No. 8,468,108, issued on Jun. 18, 2013, which claims priority to U.S. Provisional Patent Application No. 61/222,059, filed on Jun. 30, 2009, both of which are hereby incorporated herein by reference. This application is also related to co-pending application Ser. No. 12/824,184, filed on Jun. 27, 2010, entitled "Underwater Vehicles With Improved Efficiency Over A Range Of Velocities" and to co-pending application Ser. No. 12/824,186, filed on Jun. 27, 2010, entitled "Underwater Vehicles With Propulsive Systems Using Undulatory Fins," both of which are incorporated herein by reference.

FIELD OF THE INVENTION

The present invention relates to underwater vehicles, and more specifically to methods and systems that lead to increased propulsive efficiency of autonomous underwater vehicles (AUVs) over a range of velocities.

BACKGROUND

Much research and development on autonomous underwater vehicles (AUVs) has focused on larger vehicles driven by propellers (see for example "Trends in Biorobotic Autonomous Undersea Vehicles," *IEEE Journal of Oceanic Engineering*, Vol. 30, No. 1, pp. 109-139, January 2005 by P. R. Bandyopadhyay, incorporated herein by reference).

Research and development has also focused on vehicles with undulatory body motions (see for example "An Efficient Swimming Machine," *Scientific American*, Vol. 272, Issue 3, pp. 64-70, March 1995 by M. S. Triantafyllou et al., "The Geometric Mechanics of Undulatory Robotic Locomotion," *The International Journal of Robotics Research*, Vol. 17, No. 7, pp. 683-701, July 1998 by J. Ostrowski et al., "Hydrodynamics of Fishlike Swimming," *Annual Review of Fluid Mechanics*, Vol. 32, pp. 33-53, 2000 by M. S. Triantafyllou et al., "Nonlinear Control Methods for Planar Carangiform Robot Fish Locomotion," *Proceedings of the 2001 IEEE International Conference on Robotics and Automation*, pp. 427-434, 2001 by K. A. Morgansen et al., and "Design and Dynamic Analysis of Fish Robot: PoTuna," *Proceedings of the 2004 IEEE International Conference on Robotics and Automation*, pp. 4887-4892, April 2004 by E. Kim et al., each of which is incorporated herein by reference).

More recently, developments in the design and propulsion of biomimetic autonomous underwater vehicles (AUVs) have focused on boxfish as models (see for example "Biomimetic Micro Underwater Vehicle with Oscillating Fin Propulsion: System Design and Force Measurement," *Proceedings of the 2005 IEEE International Conference on Robotics and Automation*, pp. 3312-3317, April 2005 by X. Deng et al., incorporated herein by reference). In this paper a biomimetic system concept design, fabrication details and experimental force measurements on prototype boxfish-inspired vehicles are presented.

While swimming mechanics in boxfish are well understood (e.g. routine swimming performance, maneuverability and stability, carapace hydrodynamics, drag and lift, and vortical flow self-correcting forces), little attention has been given to the functional design and operation of boxfish-inspired vehicles (see for example "Does A Rigid Body Limit Maneuverability?," *The Journal of Experimental Biology*, Vol. 203, pp. 3391-3396, 2000 by J. A. Walker, "Boxfishes and Unusually Well-Controlled Autonomous Underwater Vehicles," *Physiological and Biological Zoology*, Vol. 73, No. 6, pp. 663-671, 2000 by M. S. Gordon et al., "Boxfishes (Teleoste: Ostraciidae) As A Model System For Fishes Swimming With Many Fins: Kinematics," *The Journal of Experimental Biology*, Vol. 204, pp. 1459-1471, 2001 by J. R. Hove et al., "Fish Functional Design and Swimming Performance," *Journal of Fish Biology*, Vol. 65, pp. 1193-1222, 2004 by R. W. Blake, and "Evidence of Self-Correcting Spiral Flows in Swimming Boxfishes," *Bioinspiration & Biomimetrics*, Vol. 3, 2008 by I. K. Bartol et al., each of which is incorporated herein by reference).

In particular, while boxfish-inspired vehicles have many potential advantages in operating in complex environments (e.g. high maneuverability and stability), limited battery life and payload capacities are likely functional disadvantages. In particular, boxfish employ undulatory median and paired fins during routine swimming which are characterized by high hydromechanical Froude efficiencies ($\approx 0.9$) at low forward speeds. However, current boxfish-inspired vehicles are propelled by a low aspect ratio, 'plate-like' caudal fin (ostraciiform tail) which can be shown to operate at a relatively low maximum Froude efficiency ($\approx 0.5$) and is mainly employed as a rudder for steering and in rapid swimming bouts (e.g. escape responses).

BRIEF SUMMARY OF THE INVENTION

A method of generating a model of propulsive efficiency for an autonomous underwater vehicle (AUV) is based on a multilayer perception neural network model using data from aquatic species, such as undulatory fin propulsion in the knifefish (*Xenomystus nigri*), and a sensitivity analysis is used to lower the number of required inputs. The model of propulsive efficiency allows an AUV to achieve high values of propulsive efficiency over a range of forward velocity, giving a lowered energy drain on the battery. In an embodiment, externally monitored information, such as that on flow velocity, is conveyed to an apparatus residing in the vehicle's control unit, which in turn signals the locomotive unit to adopt kinematics, such as fin frequency and amplitude, associated with optimal propulsion efficiency. Power savings could protract vehicle operational life and/or provide more power to other functions, such as communications.

DETAILED DESCRIPTION

Figure 1:
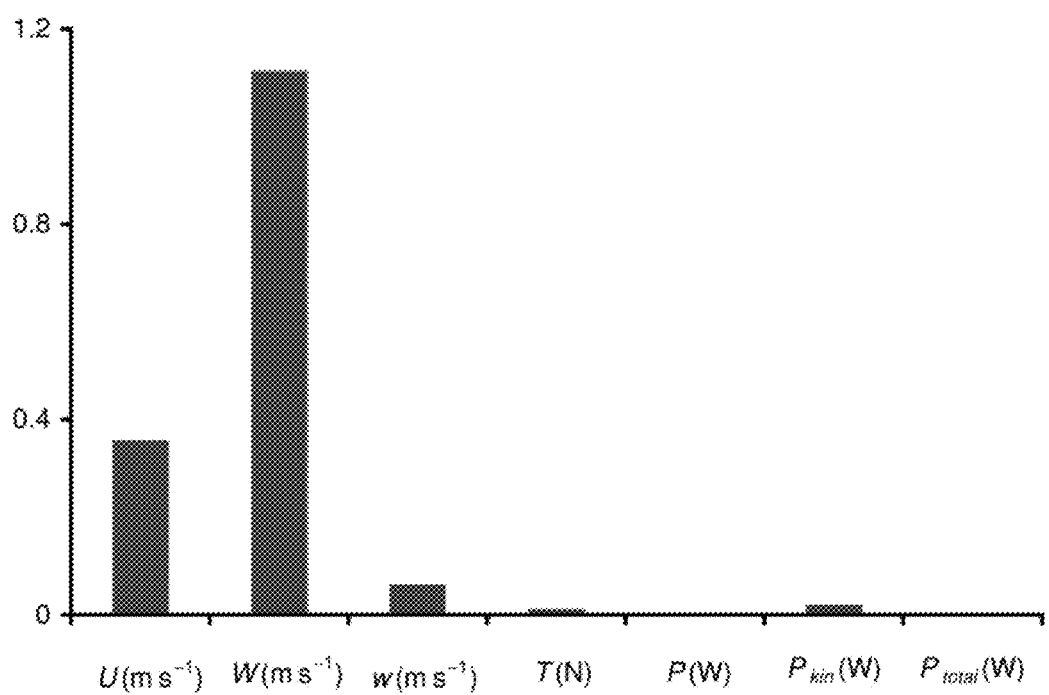
FIG. 1 illustrates the result of a sensitivity analysis of propulsive efficiency to different parameters.

A neural network model is used to develop a model of propulsive efficiency over a range of flow velocities. In an underwater vehicle, control unit circuitry is designed using this model to optimize propulsive efficiency relative to flow velocity. External information from a sensory system on flow velocity sends information to a control unit including a CPU that in turn sends control signals to a locomotive unit allowing actuators to operate at maximum efficiency relative to perceived flow conditions. Improving propulsive efficiency results in saving battery power that could protract vehicle life allow for a larger payload or provide additional power for other functions, such as communications. In an embodiment, a vehicle utilizing the model of propulsive efficiency has a substantially rigid structure, has an undulatory fin based propulsion system and is an autonomous underwater vehicle (AUV). In alternative embodiments, other vehicle body structures could be used, other types of propulsion systems could be used, and the vehicle could be under remote control rather than being autonomous.

In an experimental design, three circuit modules have been design based on multilayer perception neural network models of the hydrodynamic efficiencies of swimming in the knifefish (*Xenomystus nigri*) (see "Evaluation Using Multilayer Perception Neural Networks: A Case Study of Undulatory Median Fin Swimming in the Knifefish *Xenomystus Nigri*," *Journal of Fish Biology*, Vol. 71, pp. 1203-1207, 2007 by Li et al., incorporated herein by reference).

Specifically, a neural network model was implemented into circuitry by (1) construction of networks with the optimal topology based on experimental data; (2) sensitivity analysis of determinant factors for the Froude efficiency $\eta_p$ (i.e. forward velocity U, fin lateral velocity W=∂h/∂t where h is the distance displaced by the fin's trailing edge, and lateral velocity of pushing on the water w=(∂h∂t$^{-1}$)+U(∂h∂x$^{-1}$)); (3) validation and testing of network predictions and (4) implementation of the neural network into three circuit modules.

Neural Network Model

Neural networks are characterized by distinct topologies of nonlinear differentiable activation functions in neurons consisting of input, output and hidden layers such that each neuron of a layer is connected to all others in the next layer (see for example "A Logical Calculus of the Ideas Immanent in Nervous Activity," *Bulletin of Mathematical Biology*, Vol. 52, No. 1/2, pp. 99-115, 1990, reprinted from 1943, by W. W. McCulloch et al.).

Following the work presented in Li et al. (2007), the optimal neural network configuration was adopted from a neighborhood of 1-3 layers of 1-10 neurons. The momentum learning method was used, which is an advanced adaptive patterning learning technique progressed from the classic gradient descent method (see for example. "Electric Utility Coal Quality Analysis Using Artificial Neural Network Techniques," *Neurocomputing*, Vol. 23, pp. 195-206, 1998 by H. Salehfar et al.).

Gradient descent incorporates an error back prorogation algorithm to train weights (based on local information) for minimizing overall error. The instantaneous error of neuron i at the nth training iteration is:

$$e_i(n)=d_i(n)-y_i(n)$$

where $e_i(n)$ is the instantaneous error, $d_i(n)$ is the desired output and $y_i(n)$ is the neuron output (see for example "Modelling the Effect of Carbon Content on Hot Strength Steels Using a Modified Artificial Neural Network," *ISIJ International*, Vol. 38, No. 10, pp. 1121-1129, 1998 by L. X. Kong et al.).

Weights are trained from the iteration n+1 in gradient descent:

$$W_{ij}(n+1)=W_{ij}(n)+\gamma\delta_i(n)x_j(n)$$

where $W_{ij}(n)$ is the weight between nodes i and j at iteration n, $x_j(n)$ is the present input, $\delta_i(n)$ is the local gradient which pointed to the required change in the weight and γ is the learning rate. This method was improved by incorporating 'momentum learning' to decrease noise and increase convergence using:

$$\hat{W}_{ij}(n+1)=W_{ij}(n+1)+\alpha(W_{ij}(n)-W_{ij}(n-1))$$

where $\hat{W}_{ij}(n+1)$ and $W_{ij}(n)$ are the weights between nodes i and j at iteration n for momentum learning and gradient descent respectively and α is the momentum factor.

The stopping criterion was chosen at maximum epoch (iterations through the patterns represented in the input) of 1000 and at a mean square error (MSE)≤0.01:

$$MSE = \frac{\sum_{j=0}^{p}\sum_{i=0}^{m}(d_{ij}-y_{ij})^2}{m \cdot p}$$

where m is the size of the training dataset, p is the total number of neurons and $y_{ij}$ and $d_{ij}$ are the network and desired output for data series i at neuron j respectively.

Input data for analysis of the fin motions of the knifefish (*Xenomystus nigri*) are derived from a simplified bulk momentum approach based on elongated body theory (see for example "Hydromechanics of Aquatic Animal Propulsion," *Annual Review of Fluid Mechanics*, Vol. 1, pp. 413-446, 1969 by M. J. Lighthill, incorporated herein by reference).

In this approach, the mean thrust power $\overline{P}$ is given by subtracting the mean rate at which kinetic energy is wasted in the wake $\overline{P_k}$ from the total mean rate of working $\overline{P_t}$:

$$\overline{P}=\overline{P_t}-\overline{P_k}=U(\overline{MwW})-0.5U(\overline{Mw^2})$$

where M is the added mass at the trailing edge of the undulatory anal fin:

$$M = \frac{1}{4}\pi p d_s^2 \beta$$

where ρ, $d_s$ and β are water density, the depth of a propulsive section and the shape factor respectively. The shape factor β is considered to be approximately equal to 1 (see for example "Aquatic Animal Propulsion of High Hydromechanical Efficiency," *Journal of Fluid Mechanics*, Vol. 44, Part 2, pp. 265-301, 1970 by M. J. Lighthill, incorporated herein by reference).

The propulsive efficiency $\eta_p$ is given by:

$$\eta_p=1-(\overline{P_t}-\overline{P})/\overline{P_t}$$

The values for W, w, $\overline{P}$, $\overline{P_t}$, $\overline{P_k}$ and $\eta_p$ as a function of the swimming velocity U were taken from Table 1 of "Swimming in the Electric Eels and Knifefishes," *Canadian Journal of Zoology*, Vol., 61, pp. 1432-1441, 1983 by R. W. Blake, incorporated herein by reference.). This table is illustrated below:

| U | $R_L$ | U | W | w | $\overline{T}$ | $\overline{P}$ | $\overline{P}_{kin}$ | $\overline{P}_{tot}$ | $\eta_P$ |
|---|---|---|---|---|---|---|---|---|---|
| 0.413 | 6.2 | 2.75 | 0.516 | 0.125 | 8.62 | 35.6 | 6.46 | 42.0 | 0.85 |
| 0.306 | 4.5 | 2.00 | 0.390 | 0.108 | 5.50 | 16.5 | 3.48 | 19.9 | 0.83 |
| 0.370 | 5.5 | 2.46 | 0.478 | 0.115 | 7.36 | 27.2 | 3.74 | 31.0 | 0.88 |
| 0.333 | 5.0 | 2.22 | 0.433 | 0.108 | 6.22 | 20.6 | 2.96 | 23.6 | 0.87 |
| 0.260 | 3.9 | 1.73 | 0.369 | 0.084 | 4.20 | 10.92 | 1.40 | 12.32 | 0.88 |
| 0.200 | 3.0 | 1.33 | 0.260 | 0.069 | 2.22 | 4.44 | 0.74 | 5.18 | 0.86 |
| 0.178 | 2.6 | 1.15 | 0.221 | 0.069 | 1.96 | 3.34 | 0.62 | 3.96 | 0.84 |
| 0.170 | 2.55 | 1.13 | 0.210 | 0.068 | 1.84 | 3.12 | 0.60 | 3.72 | 0.84 |
| 0.153 | 2.3 | 1.02 | 0.201 | 0.065 | 1.66 | 2.54 | 0.50 | 3.04 | 0.84 |
| 0.150 | 2.25 | 1.00 | 0.191 | 0.061 | 1.46 | 2.20 | 0.42 | 2.62 | 0.84 |
| 0.136 | 2.05 | 0.91 | 0.162 | 0.053 | 1.08 | 1.48 | 0.28 | 1.76 | 0.84 |
| 0.133 | 2.0 | 0.89 | 0.153 | 0.052 | 1.02 | 1.22 | 0.28 | 1.50 | 0.81 |
| 0.130 | 1.95 | 0.87 | 0.142 | 0.052 | 0.92 | 1.20 | 0.26 | 1.46 | 0.82 |
| 0.117 | 1.75 | 0.78 | 0.149 | 0.049 | 0.94 | 1.10 | 0.22 | 1.50 | 0.83 |
| 0.103 | 1.55 | 0.67 | 0.127 | 0.049 | 0.76 | 0.78 | 0.18 | 0.98 | 0.80 |
| 0.094 | 1.41 | 0.63 | 0.130 | 0.044 | 0.72 | 0.68 | 0.14 | 0.82 | 0.82 |
| 0.090 | 1.35 | 0.60 | 0.131 | 0.043 | 0.72 | 0.66 | 0.12 | 0.78 | 0.83 |
| 0.087 | 1.30 | 0.58 | 0.126 | 0.044 | 0.70 | 0.60 | 0.12 | 0.74 | 0.82 |
| 0.085 | 1.27 | 0.57 | 0.111 | 0.045 | 0.60 | 0.52 | 0.12 | 0.64 | 0.80 |
| 0.082 | 1.23 | 0.55 | 0.109 | 0.044 | 0.58 | 0.46 | 0.12 | 0.58 | 0.78 |
| 0.080 | 1.20 | 0.53 | 0.107 | 0.039 | 0.52 | 0.41 | 0.10 | 0.52 | 0.81 |
| 0.079 | 1.19 | 0.52 | 0.103 | 0.040 | 0.50 | 0.40 | 0.10 | 0.50 | 0.80 |
| 0.077 | 1.16 | 0.51 | 0.092 | 0.039 | 0.44 | 0.32 | 0.08 | 0.40 | 0.80 |
| 0.076 | 1.12 | 0.50 | 0.083 | 0.035 | 0.34 | 0.28 | 0.08 | 0.34 | 0.78 |
| 0.073 | 1.11 | 0.49 | 0.076 | 0.037 | 0.32 | 0.24 | 0.08 | 0.32 | 0.75 |
| 0.067 | 1.00 | 0.45 | 0.061 | 0.038 | 0.24 | 0.16 | 0.08 | 0.24 | 0.67 |
| 0.066 | 0.91 | 0.44 | 0.058 | 0.036 | 0.22 | 0.14 | 0.06 | 0.20 | 0.70 |
| 0.056 | 0.84 | 0.37 | 0.056 | 0.036 | 0.20 | 0.12 | 0.06 | 0.18 | 0.67 |

Sensitivity Analysis

Sensitivity analysis was performed on the trained neural network to determine the relative importance of each variable using weights derived from the training process and measuring the change in the predicted output for every 50 divisions of 1 SD of the mean input. The optimality and accuracy was tested based on the cross-validation scheme using 50% of the dataset for training and 50% for MLP-NN performance testing. The sensitivity analysis showed that the swimming speed U and fin lateral speed W were the major determinants of $\eta_p$ and this suggested the use of these parameters for implementation into circuitry. In alternative embodiments, the parameter w could also have been included as an input, as well as other parameters.

FIG. 1 illustrates sensitivity for the predicted efficiency $\eta_p$ (defined as the change in the mean output for every 50 divisions within 1 SD of the mean input), swimming speed U, lateral velocity of the fin W, lateral velocity of pushing on the water slice w, thrust T, mean thrust power P, kinetic energy wasted in the wake $P_{kin}$ and mean total power $P_{tot}$. The numerical results of the sensitivity analysis are shown in the table below:

| Parameter | Sensitivity to rip |
|---|---|
| U (m s-1) | 0.356122 |
| W (m s-1) | 1.114775 |
| w (m s-1) | 0.061856 |
| T (x 110-3N) | 0.011263 |
| P (x10-4W) | 0.000644 |
| $P_{kin}$ (x10-4W) | 0.019360 |
| $P_{tot}$ (x10-4W) | 0.000158 |

Figure 2:
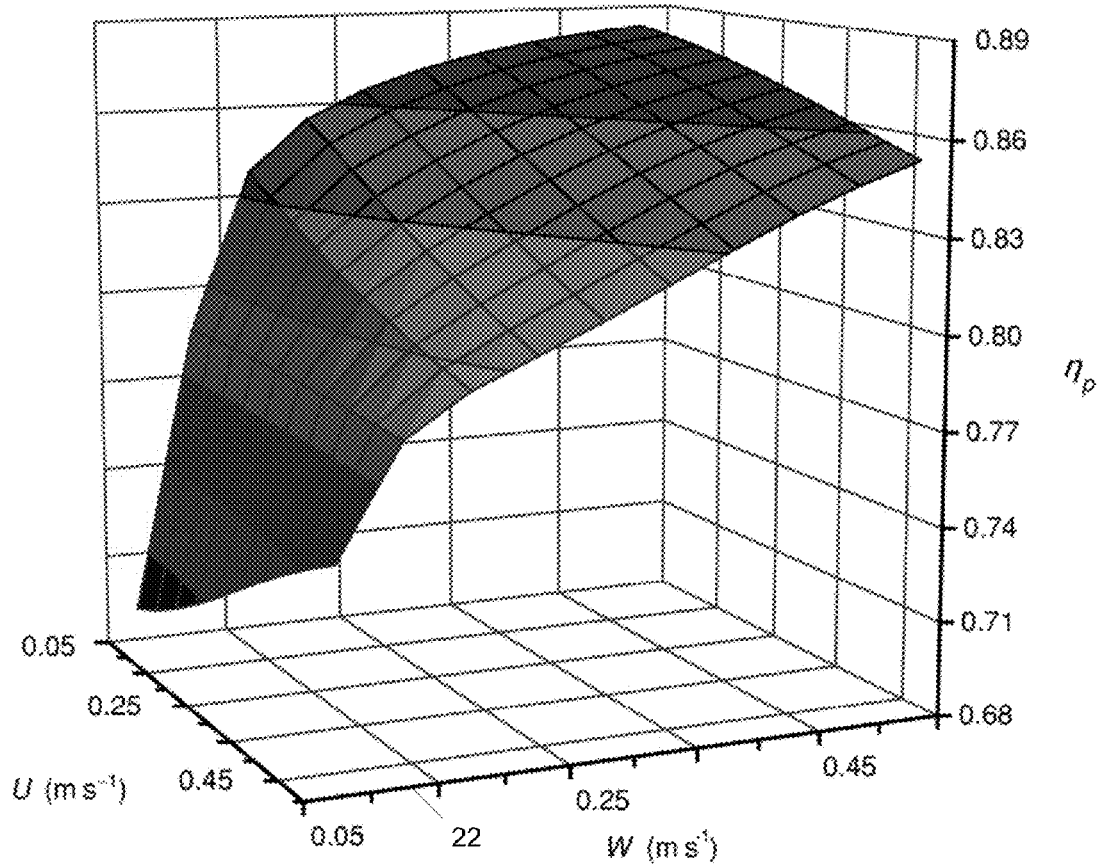
FIG. 2 illustrates a model of propulsive efficiency as a function of two parameters.

The neural network model was then constructed based on the cross-validation scheme (75% of the data were used to train the neural network and 25% was used to test its performance) and good agreement was found between neural network predictions and actual values (P>0.05). FIG. 2 shows a three-dimensional representation of the output from the trained neural network based on U, W and $\eta_p$. The output of the trained neural network is shown in the table below:

| | W | | | | | | | | | |
|---|---|---|---|---|---|---|---|---|---|---|
| U | 0.05 | 0.10 | 0.15 | 0.20 | 0.25 | 0.30 | 0.35 | 0.40 | 0.45 | 0.50 |
| 0.05 | 0.69 | 0.79 | 0.84 | 0.86 | 0.86 | 0.87 | 0.88 | 0.88 | 0.88 | 0.88 |
| 0.10 | 0.70 | 0.79 | 0.83 | 0.85 | 0.86 | 0.87 | 0.87 | 0.88 | 0.88 | 0.88 |
| 0.15 | 0.70 | 0.79 | 0.83 | 0.84 | 0.85 | 0.86 | 0.87 | 0.87 | 0.88 | 0.88 |
| 0.20 | 0.71 | 0.79 | 0.82 | 0.84 | 0.85 | 0.86 | 0.86 | 0.87 | 0.87 | 0.88 |
| 0.25 | 0.71 | 0.79 | 0.81 | 0.83 | 0.84 | 0.85 | 0.86 | 0.86 | 0.87 | 0.87 |
| 0.30 | 0.72 | 0.78 | 0.81 | 0.82 | 0.83 | 0.84 | 0.85 | 0.86 | 0.86 | 0.87 |
| 0.35 | 0.73 | 0.78 | 0.81 | 0.82 | 0.83 | 0.84 | 0.85 | 0.85 | 0.86 | 0.87 |
| 0.40 | 0.74 | 0.78 | 0.80 | 0.81 | 0.82 | 0.83 | 0.84 | 0.85 | 0.86 | 0.86 |
| 0.45 | 0.74 | 0.78 | 0.80 | 0.81 | 0.82 | 0.83 | 0.84 | 0.84 | 0.85 | 0.86 |
| 0.50 | 0.75 | 0.78 | 0.80 | 0.80 | 0.81 | 0.82 | 0.83 | 0.84 | 0.85 | 0.85 |

Experimental Implementation

Three circuit modules were designed: (1) fin lateral speed versus swimming speed giving propulsive efficiency (FIG. 3), (2) propulsive efficiency versus fin lateral speed giving swimming speed (FIG. 4A) and (3) propulsive efficiency versus swimming speed giving fin lateral speed (FIG. 4B). The experimental implementation (summarized in FIGS. 3, 4A and 4B and consisting of 1918, 2318 and 2362 gates respectively) utilizes inverters as well as logic circuits of two, three and four 6-bit and 7-bit inputs. Each module is composed of combinatorial logic and is activated by two inputs and produces one output. Each module represents the entire array of swimming efficiencies, swim speeds and fin speed efficiencies illustrated in FIG. 2.

Figure 3:
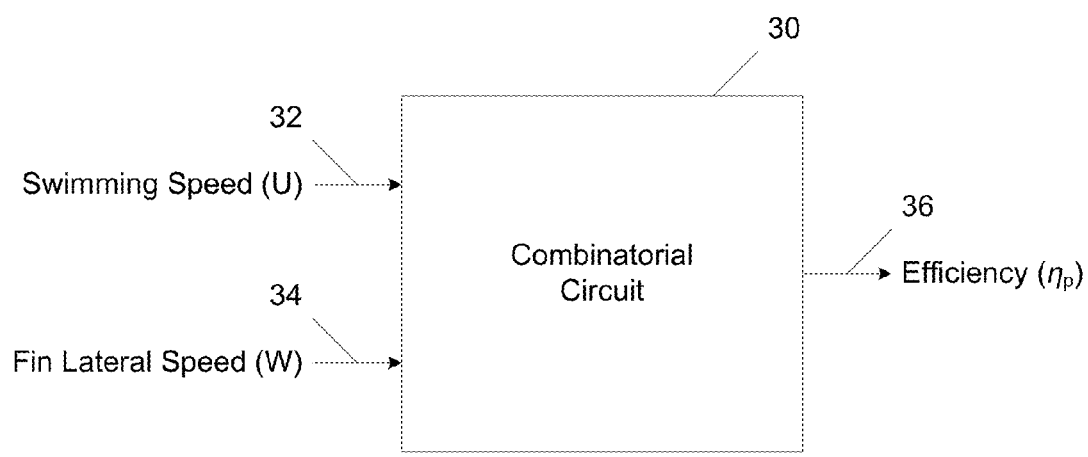
FIG. 3 illustrates an apparatus for computing efficiency as a function of two parameters.

In FIG. 3, swimming speed (U) is input at 32 into combinatorial circuit 30 and fin lateral speed (W) is input at 34. Propulsive efficiency ($\eta_p$) is output at 36 from combinatorial circuit 30. In an embodiment, inputs 32 and 34 consist of 6-bit inputs that encode the input parameters as binary values. Other widths of input and other forms of encoding the input parameters are possible. In an embodiment, output 36 contains an individual signal for each value in the efficiency curve. In other embodiments, output 36 can be encoded as a binary value. In some embodiments, circuit 30 may be replaced by a sequential circuit or may be implemented as a software routine in the control unit of a vehicle. In some embodiments interpolation between points on the efficiency curve may be performed to provide an output for all input values.

Figure 4A:
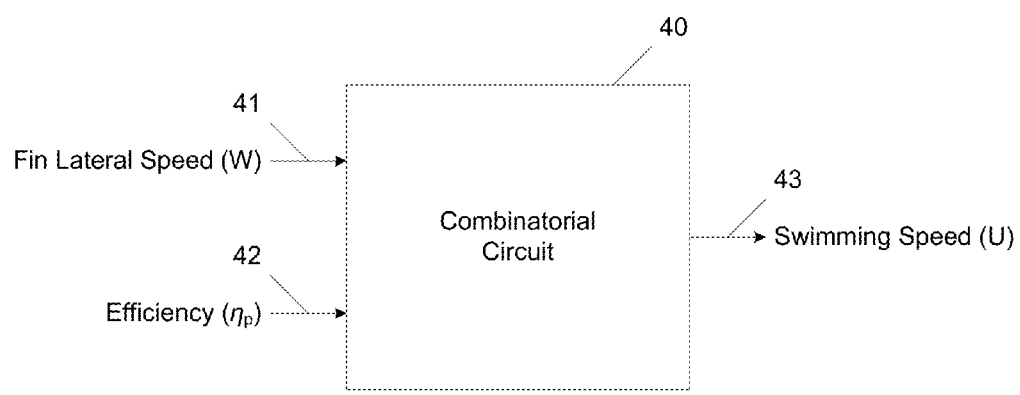
FIG. 4A illustrates an apparatus for computing a parameter as a function of efficiency and a second parameter.
Figure 4B:
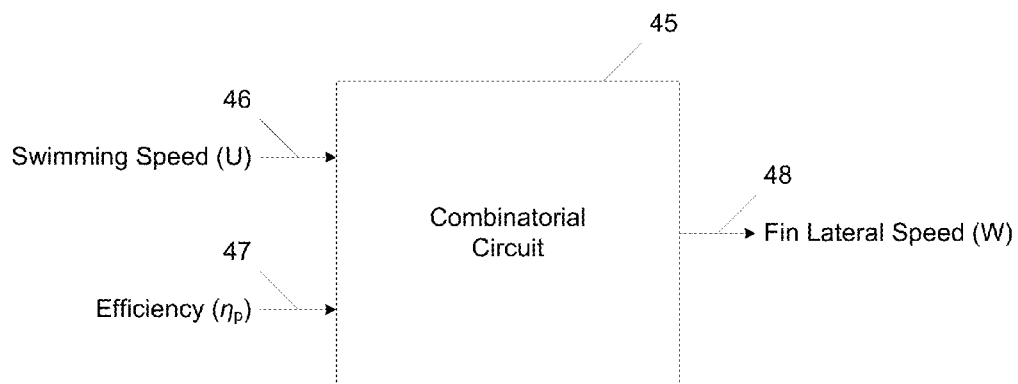
FIG. 4B illustrates an apparatus for computing a parameter as a function of efficiency and a second parameter.

In FIG. 4A, fin lateral speed (W) is input at 41 into combinatorial circuit 40 and propulsive efficiency ($\eta_p$) is input at 42. Swimming speed (U) is output at 43 from combinatorial circuit 40. In an embodiment, inputs 41 and 42 consist of 6-bit and 7-bit inputs respectively that encode the inputs as binary values. Other widths of input and other forms of encoding the inputs are possible. In an embodiment, output 43 contains an individual signal for each value of swimming speed. In other embodiments, output 43 can be encoded as a binary value. In some embodiments, circuit 40 may be replaced by a sequential circuit or may be implemented as a software routine in the control unit of a vehicle. In some embodiments interpolation between points on the efficiency curve may be performed to provide an output for all input values.

In FIG. 4B, swimming speed (U) is input at 46 into combinatorial circuit 45 and propulsive efficiency ($\eta_p$) is input at 47. Fin lateral speed (W) is output at 48 from combinatorial circuit 45. In an embodiment, inputs 46 and 47 consist of 6-bit and 7-bit inputs respectively that encode the inputs as binary values. Other widths of input and other forms of encoding the inputs are possible. In an embodiment, output 48 contains an individual signal for each value of fin lateral speed. In other embodiments, output 48 can be encoded as a binary value. In some embodiments, circuit 45 may be replaced by a sequential circuit or may be implemented as a software routine in the control unit of a vehicle. In some embodiments interpolation between points on the efficiency curve may be performed to provide an output for all input values.

A variety of control scenarios are possible with the circuits illustrated in FIGS. 3, 4A and 4B or with alternative embodiments of these circuits. Note that the outputs of circuits 30, 40 and 45 are equal to the results of the neural network model. The values of propulsive efficiency are at least 0.69 for all inputs and achieve 0.88 at higher forward velocities. By having a model of efficiency over a range of forward velocities, it is possible for the control unit of an underwater vehicle to utilize such information to improve propulsive efficiency given the other constraints imposed by the overall system.

Summary

A basic design for the major design units of biomimetic MUVs based on oscillatory propulsion employing a boxfish model are described in Deng et al. (2005). In this design, there are five main units: locomotory, sensory, power, communications and control. In this design, the MUV is propelled by an electromechanical actuated-fin system. Two side fins (for steering and moving upward and downward) and a plate-like caudal fin (ostraciiform tail) for propulsion are driven by a PZT bimorph actuator with motion amplification from four bar mechanisms. The fins are powered by electric energy (e.g. a lithium battery) and the power supply, communications (e.g. ultrasonic transmitters), sensory (e.g. flow velocity detection) units feed into the control (CPU) unit.

Other types of propulsion system have been studied based on different biomimetic models besides the ostraciiform propulsion of the boxfish. For example anguilliform propulsion is described in Ostrowski et al. (1998), carangiform propulsion (where approximately two thirds of the body undulates) is described in Morgansen et al. (2001), thunniform propulsion is described in Triantafyllou et al. (1995), incorporated herein by reference, and an undulatory fin model is described in "Biomimetric Compliant System for Smart Actuator-Driven Aquatic Propulsion: Preliminary Results," *Proceedings of* 203 *ASME International Mechanical Engineering Congress & Exposition* (*IMECE* '03), November 2003 by B. P. Trease et al., incorporated herein by reference, and "Kinematics and Force Characterization of a Knifefish-Inspired Mechanical Propulsor," *Proceedings of Biological Approaches to Engineering Conference*, March 2008 by K. Collins et al., incorporated herein by reference. In the case of undulatory fins, Trease et al. (2003) describes sinusoidally undulating flexible fins with distributed compliance based on a rib structure and Collins et al. (2008) describes such a design incorporated into a 'WaveDrive' actuating mechanism with preliminary measurements on thrust production.

Nevertheless, currently the 'ostraciiform model' is favored with respect to the design and function of small, highly maneuverable and stable AUVs (see for example Gordon et al. (2000), "Hydrodynamic Stability of Swimming In Ostraciid Fishes: Role of the Carapace in the Smooth Trunkfish *Lactophyrs triqueter* (Teleostei: Ostraciidae)," *The Journal of Experimental Biology*, Vol. 206, pp. 725-744, 2003 by I. K. Bartol et al., "Fish Functional Design and Swimming Performance," *Journal of Fish Biology*, Vol. 65, pp. 1193-1222, 2004 by R. W. Blake, and Deng et al. (2005), each of which is incorporated herein by reference).

While these approaches to AUV function have certain advantages as far as body design, maneuverability and stability are concerned, the current focus on an oscillating plate as a basis for propulsion has significant disadvantages. In particular, it can be shown that the maximum Froude efficiency of a low aspect ratio 'plate-like' caudal fin propeller (ostraciiform tail) has a relatively low upper value of approximately 0.5 (see for example "Mechanics of Ostraciiform Propulsion," *Canadian Journal of Zoology*, Vol. 59, pp. 1067-1071, 1981 by R. W. Blake). In fact, boxfish are not propelled by the reciprocating motions of their caudal fin during routine activity. Rather, they swim through the action of undulatory median and paired fins and, in rectilinear swimming, the caudal fin is often collapsed presumably to reduce drag. It has been observed that the caudal fin is mainly employed as a rudder for steering and in bouts of unsteady swimming.

A more efficiently propelled underwater vehicle can be achieved by using an undulatory fin and can use a control unit that utilizes a model of swimming efficiency over a range of velocities. Undulatory fin based propulsion results in increased efficiency over a range of velocities and is particularly well adapted to vehicles utilizing low velocities and lower power utilization. In an embodiment of such a vehicle, part of a control unit could be based on the three circuit modules described above to optimize propulsive efficiency relative to the flow velocity. External information on flow velocity could be conveyed by sensor signals to the control unit which in turn could instruct the locomotor unit to appropriately match fin frequency, and hence W, to achieve optimum propulsive efficiency. Under these conditions, the energy drain on the power unit would be minimized at any given U. This power saving could protract the operational life of the vehicle and/or provide more power to other functions such as sensors and communications.

Undulatory median and paired fin swimming is an adaptation for propulsion for high hydromechanical efficiency at low forward speeds (see for example Blake (2004)). Given that biomimetically inspired engineering designs need not be constrained by the limitations imposed by phylogenetic (historical) or ontogenetic (developmental) factors, optimal structural and functional solutions can be found by selecting appropriate design features from a variety of 'fish models'. Specifically, the relatively low drag, high stability and maneuverability of the boxfish carapace can be combined with an undulatory fin-based propulsion system rather than an oscillating fin design.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. The scope of present invention is defined by the appended claims.

The invention claimed is:

1. A method of determining a propulsive efficiency of an underwater vehicle in operation comprising steps of:
providing data representing a plurality of parameters from measurements of one or more aquatic species over a variety of swimming speeds;
developing a model of propulsive efficiency utilizing said data, wherein said model utilizes a selected subset of said parameters to approximate propulsive efficiency;
implementing said model of propulsive efficiency in a control apparatus;
using said control apparatus in real time to compute a propulsive efficiency of an underwater vehicle while in operation over a range of velocities such that a largest and smallest velocity have a ratio of 10 to 1 or greater.

2. The method of claim 1 wherein said step of using comprises steps of:
measuring one or more of said selected subset of said parameters from an environment of said underwater vehicle while in operation;
utilizing results of said step of measuring to approximate propulsive efficiency of said underwater vehicle in real time;
controlling a locomotor system of said underwater vehicle based on said step of utilizing.

3. The method of claim 1 wherein said step of implementing comprises providing combinatorial circuitry.

4. The method of claim 1 wherein said step of implementing comprises providing a central processing unit (CPU) and program code.

5. The method of claim 1 wherein said one or more aquatic species comprises a *Xenomystus nigri*.

6. The method of claim 1 where said underwater vehicle comprises a substantially rigid structure and said locomotor system comprises an undulatory fin propulsion system.

7. The method of claim 1 wherein said selected subset of said parameters includes a forward velocity.

8. The method of claim 1 wherein said selected subset of said parameters includes a lateral fin speed.

9. The method of claim 1 wherein said selected subset of said parameters includes a lateral velocity of pushing on water.

10. The method of claim 1 wherein said autonomous underwater vehicle is operated at propulsive efficiencies greater than 0.70 over said range of velocities.

11. The method of claim 1 wherein said range of velocities comprises at least a range of 0.05 meters per second to 0.50 meters per second.

12. The method of claim 1 wherein said underwater vehicle is an autonomous underwater vehicle (AUV).

13. The method of claim 1 wherein said underwater vehicle is under remote control.

* * * * *